US006673715B2

(12) United States Patent
Trivedi et al.

(10) Patent No.: US 6,673,715 B2
(45) Date of Patent: Jan. 6, 2004

(54) METHODS OF FORMING CONDUCTIVE CONTACTS

(75) Inventors: Jigish D. Trivedi, Boise, ID (US); Zhongze Wang, Boise, ID (US); Chi-Chen Cho, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/002,335

(22) Filed: Oct. 24, 2001

(65) Prior Publication Data

US 2003/0077890 A1 Apr. 24, 2003

(51) Int. Cl.[7] .................................. H01L 21/44
(52) U.S. Cl. .................. 438/655; 438/299; 438/682; 438/672; 438/675
(58) Field of Search ....................... 438/299, 300, 438/303, 199, 233, 648, 649, 650, 651, 655, 664, 672, 675, 682, 683, 630

(56) References Cited

U.S. PATENT DOCUMENTS 4,443,930 A * 4/1984 Hwang et al. ......... 204/192.15
5,356,834 A * 10/1994 Sugimoto et al. .. 148/DIG. 133
5,899,742 A * 5/1999 Sun ..................... 148/DIG. 19

OTHER PUBLICATIONS

Merriam Webster's Collegiate Dictionary, the 10th edition, pp 811.*

* cited by examiner

Primary Examiner—Carl Whitehead, Jr.
Assistant Examiner—Thanhha Pham
(74) Attorney, Agent, or Firm—Wells St. John P.S.

(57) ABSTRACT

Methods of forming conductive contacts are described. According to one implementation, the method includes forming a transistor gate structure over a substrate. The gate structure includes a conductive silicide covered by insulative material. A dielectric layer is formed over the substrate and the gate structure. A contact opening is etched into the dielectric layer adjacent the gate structure. After the etching, the substrate is exposed to oxidizing conditions effective to oxidize any conductive silicide within the contact opening which was exposed during the contact opening etch. After the oxidizing, conductive material is formed within the contact opening. According to another embodiment, after the etching, it is determined whether conductive silicide of the gate structure was exposed during the etching. The substrate is then exposed to oxidizing conditions only if conductive silicide of the gate structure was exposed during the etching.

40 Claims, 6 Drawing Sheets

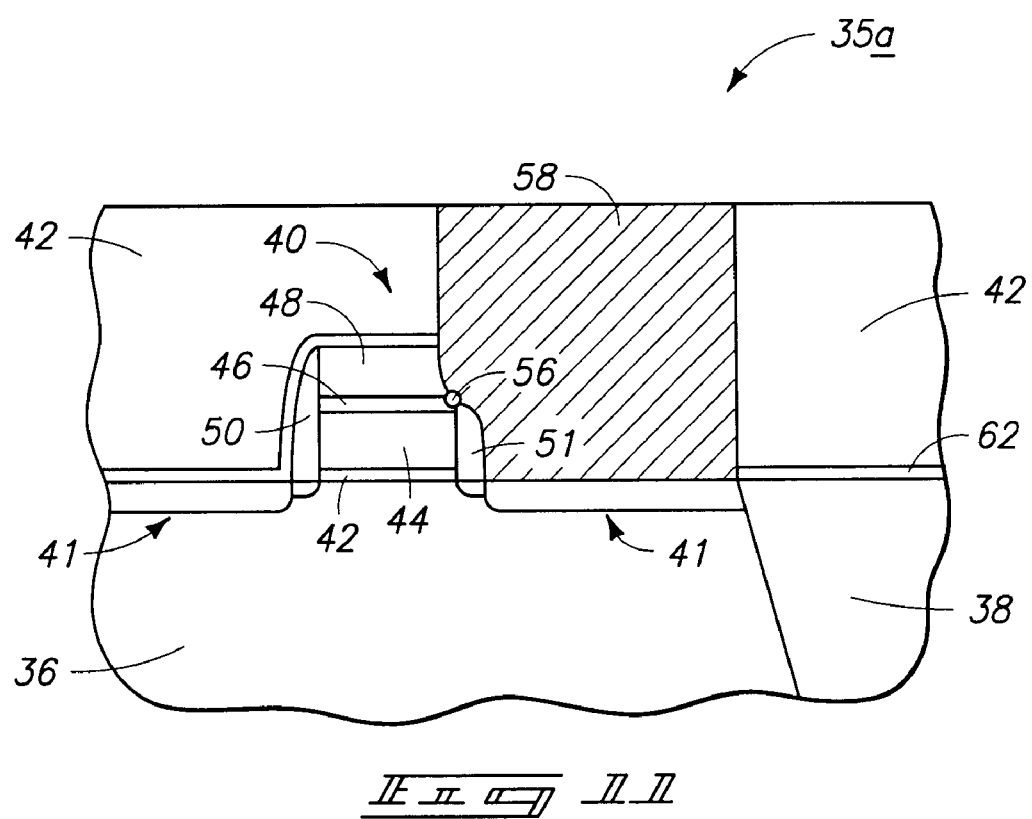

METHODS OF FORMING CONDUCTIVE CONTACTS

TECHNICAL FIELD

This invention relates to methods of forming conductive contacts.

BACKGROUND OF THE INVENTION

In semiconductor wafer fabrication, conductive contacts are typically made between different device components and conductive lines. One particular aspect of one form of semiconductor processing, and problems associated therewith, is described with reference to FIGS. 1–3. FIG. 1 depicts a semiconductor wafer fragment 10 comprised of a bulk monocrystalline silicon substrate 12 having a trench isolation region 14 formed therein. Isolation region 14 typically comprises a silicon dioxide comprising material. In the context of this document, the term "layer" refers to both the singular and plural. Further, in the context of this document, the term "semiconductive substrate" or "semiconductor substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other material). The term "substrate" refers to any supporting structure, including, but not limited to, the semiconductive substrates described above.

Wafer fragment 10 comprises a field effect transistor gate structure 16 having source/drain regions 17 and 18 formed within substrate 12. Transistor gate structure 16 comprises a gate dielectric layer 20, an overlying conductively doped polysilicon layer 22, an overlying conductive silicide region 23 and an overlying insulative cap 24. Exemplary materials for gate dielectric layer 20 includes silicon dioxide, for silicide layer 23 tungsten silicide, and for insulative cap 24 silicon nitride. Anisotropically etched sidewall spacers 25 are formed laterally about sidewalls of transistor gate structure 16.

An etch stop layer 26 is formed over transistor gate structure 16 and substrate 12/14. Exemplary typical materials include undoped silicon dioxide, silicon nitride or a silicon oxynitride. The typical thickness of the etch stop layer 26 is 300 Å, with a preferred range of thickness being from 150 Å to 1000 Å. A planarized insulative dielectric layer 28, for example borophosphosilicate glass (BPSG), is provided over etch stop layer 26.

Referring to FIG. 2, a contact opening 30 has been etched through insulative dielectric layer 28 to substrate 12. Such would typically be conducted by photolithographic processing providing a layer of photoresist and a mask opening therethrough which provides the exposed area of material 28 for the etch. The illustrated etch is typically referred to as a self-aligned-contact etch as the materials of circuitry construction and the etch chemistry is intended to be largely selective to etch material 28 without necessarily etching transistor gate structure 16 and etch stop layer 26 thereover. The illustrated prior art processing would typically etch material 28 in a manner which is intended to be highly selective to stop at etch stop layer 26, and etch stop layer 26 would thereafter be etched to provide exposure to source/drain region 18. Tungsten suicide typically etches faster than silicon.

Although intended to be highly selective and self-aligning, in certain instances the exposed spacer 25 and perhaps some of the insulative cap 24 might be etched as shown to provide some exposure of conductive silicide region 23. Referring to FIG. 3, this is highly undesirable as contact opening 30 is typically ultimately plugged with a conductive material 32 which undesirably creates a fatal short to the conductive silicide of the gate structure.

The invention was principally motivated in overcoming the above-identified problem. However the invention is in no way so limited, and is only limited by the accompanying claims as literally worded and appropriately interpreted in accordance with the Doctrine of Equivalents.

SUMMARY OF THE INVENTION

Methods of forming conductive contacts are described. According to one implementation, the method includes forming a transistor gate structure over a substrate. The gate structure includes a conductive silicide covered by insulative material. A dielectric layer is formed over the substrate and the gate structure. A contact opening is etched into the dielectric layer adjacent the gate structure. After the etching, the substrate is exposed to oxidizing conditions effective to oxidize any conductive suicide within the contact opening which was exposed during the contact opening etch. After the oxidizing, conductive material is formed within the contact opening.

According to one implementation, the method includes forming a transistor gate structure over a substrate. The gate structure includes a conductive suicide covered by insulative material. A dielectric layer is formed over the substrate and the gate structure. A contact opening is then etched into the dielectric layer adjacent the gate structure. After the etching, it is determined whether conductive silicide of the gate structure was exposed during the etching. If it is determined that conductive silicide of the gate structure was exposed during the etching, the exposed silicide within the contact opening is oxidized effective to form an insulative isolation mass within the contact opening on the conductive silicide. After the oxidizing, conductive material is formed within the contact opening and on the insulative isolation mass. If it is determined that conductive silicide of the gate structure was not exposed during said etching, conductive material is formed within the contact opening without conducting said oxidizing.

BRIEF DESCRIPTION OF THE DRAWINGS

Preferred embodiments of the invention are described below with reference to the following accompanying drawings.

FIG. 11 is a view of the FIG. 10 wafer fragment at a processing step subsequent to that shown by FIG. 10.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
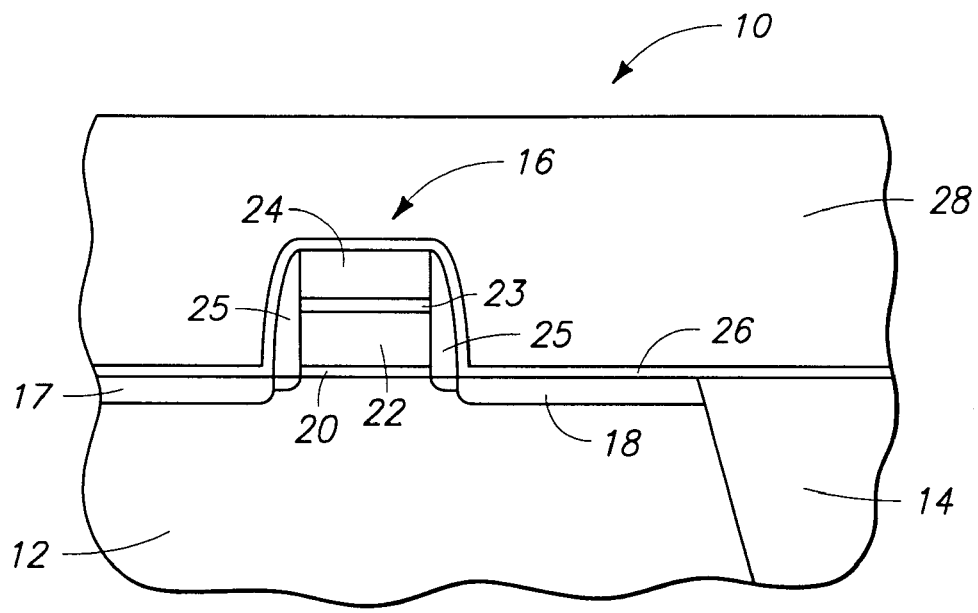
FIG. 1 is a diagrammatic sectional view of a prior art semiconductor wafer fragment at one prior art processing step.
Figure 2:
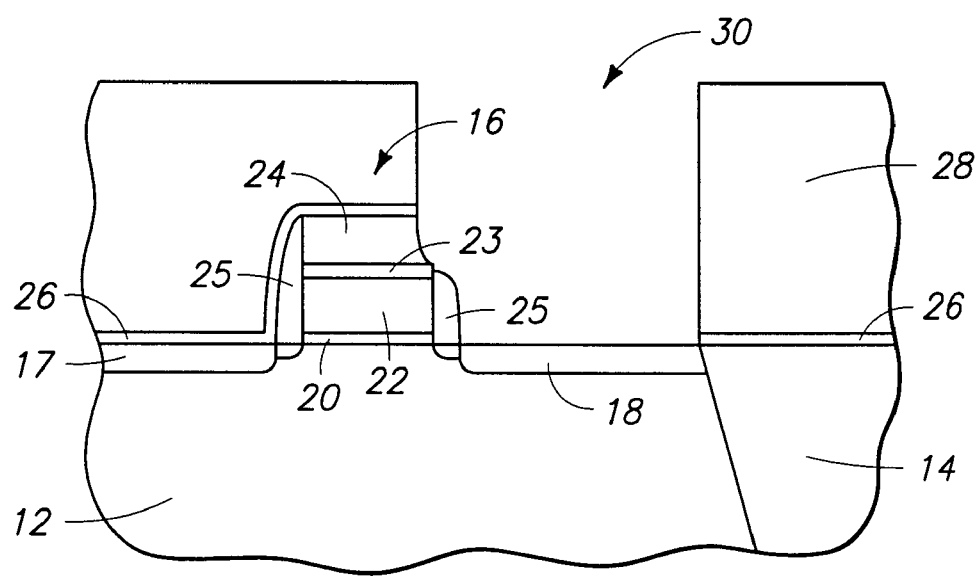
FIG. 2 is a view of the FIG. 1 wafer fragment at a processing step subsequent to that shown by FIG. 1.
Figure 3:
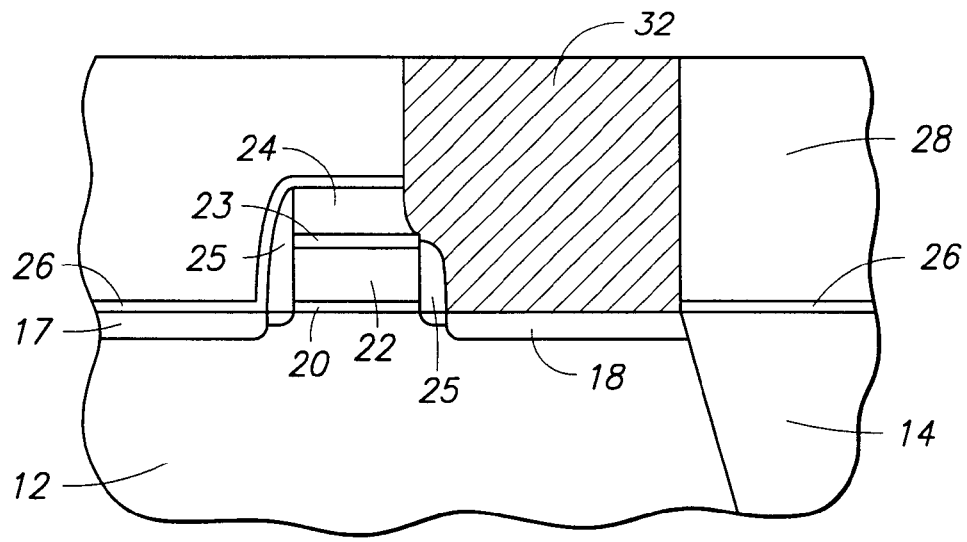
FIG. 3 is a view of the FIG. 2 wafer fragment at a processing step subsequent to that shown by FIG. 2.
Figure 4:
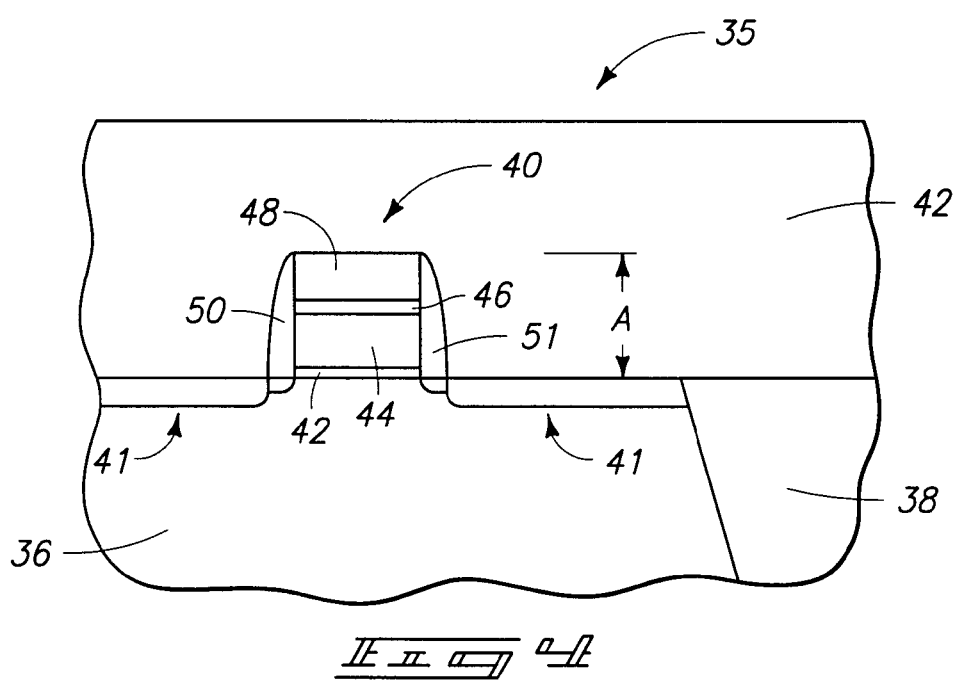
FIG. 4 is a diagrammatic sectional view of a semiconductor wafer fragment at one processing step in accordance with one aspect of the invention.

A first preferred embodiment method of forming a conductive contact is described initially with reference to FIGS. 4–7. Referring to FIG. 4, a wafer fragment 35 comprises a bulk substrate 36 and an isolation region 38 formed therein. Bulk monocrystalline silicon is a preferred material for substrate 36, while a preferred isolation region 38 comprises a trench isolation region formed in part by filling with high density plasma deposited oxide. A transistor gate structure 40 is formed over substrate 36. Laterally opposing source/drain regions 41 are formed within substrate 36 relative to opposing sides of transistor gate structure 40.

Transistor gate structure 40 comprises a gate dielectric layer 42, a conductively doped polysilicon layer 44, and a conductive silicide layer 46. But one example conductive silicide is $WSi_x$. Stoichiometric $WSi_2$ is one specific example. However, utilizing silicon-rich tungsten silicide, or other silicon-rich silicides, is more preferred. Specific examples include "x" being greater than 2 and less than 3, with 2.5 being a more specific example. The conductive silicide is preferably covered by insulative material. In the illustrated and preferred embodiment, the insulative material is in part provided in the form of an insulative cap 48 which is formed on (in contact with) conductive silicide 46, and has the same approximate lateral dimensions as conductive silicide layer 46 and polysilicon layer 44. The preferred embodiment wafer fragment 35 also is shown to include opposing respective insulative sidewall spacers 50 and 51. For purposes of the continuing discussion, sidewall spacer 51 can be considered as having an initial height "A". A dielectric layer or insulative material 42 is formed over substrate 36/38 and gate structure 40. Such layer is also preferably planarized, with preferred planarization techniques being re-flow or CMP. Exemplary materials for layer 42 are BPSG or PSG.

The illustrated and described preferred transistor gate structure 40 comprises but one preferred embodiment gate structure fabricated in accordance with methodical aspects of the invention. Any other transistor gate structure is contemplated, whether existing or yet-to-be developed, in accordance with the invention as long as such includes at least a conductive silicide which is at some point covered by insulative material regardless of whether such insulative material contacts the subject silicide.

Figure 5:
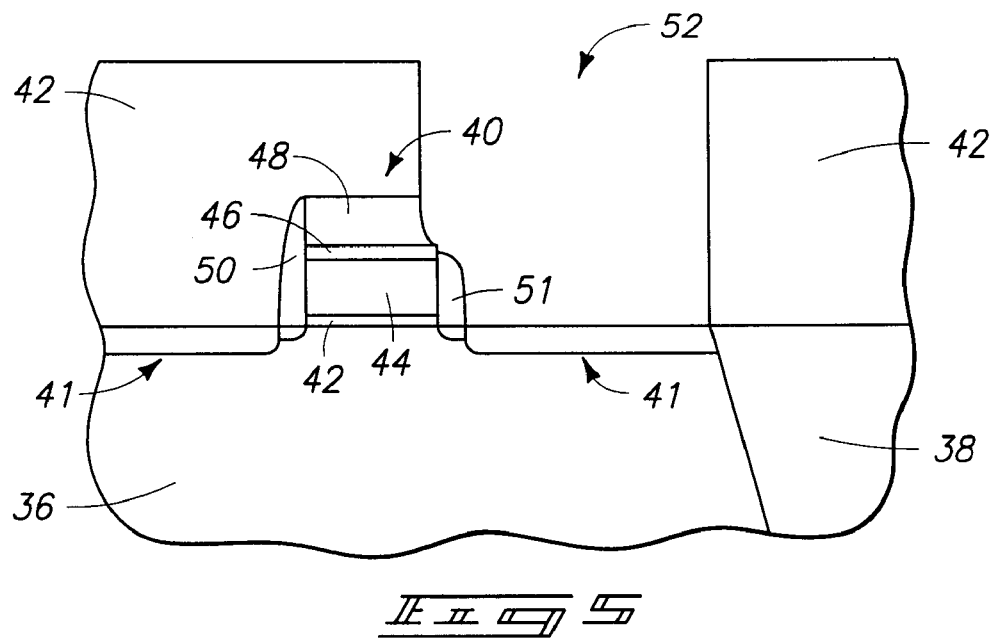
FIG. 5 is a view of the FIG. 4 wafer fragment at a processing step subsequent to that shown by FIG. 4.

Referring to FIG. 5, a contact opening 52 is etched into dielectric layer 42 adjacent gate structure 40 effective to expose conducive silicide 46 of gate structure 40. In the depicted preferred embodiment, such etching is also effective to expose insulative cap 48 and insulative sidewall spacer 51. Further in the illustrated preferred embodiment, insulative sidewall spacer 51 has also been etched effectively reducing its initial height "A", and a portion of insulative cap 48 is also shown as being etched.

Figure 6:
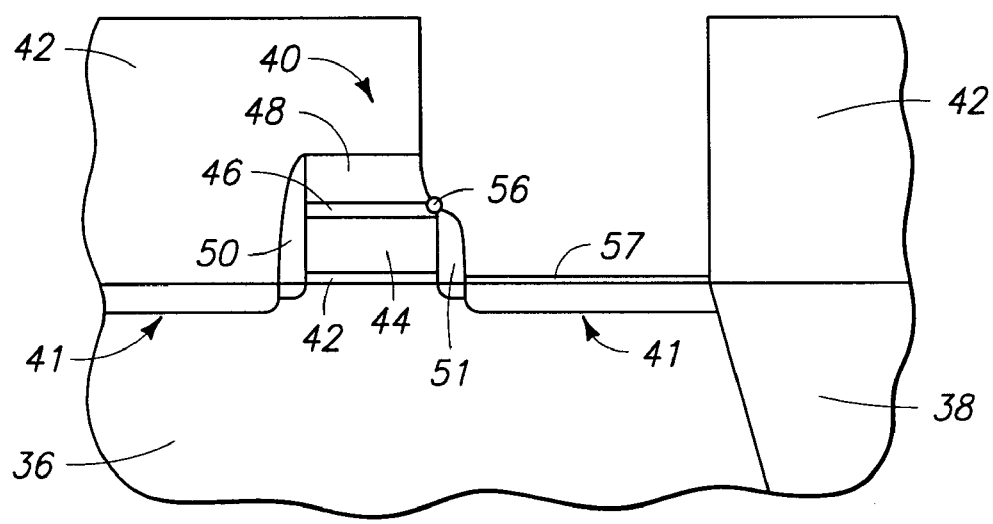
FIG. 6 is a view of the FIG. 5 wafer fragment at a processing step subsequent to that shown by FIG. 5.

Referring to FIG. 6, the exposed silicide of silicide layer 46 is exposed to oxidizing conditions effective to oxidize it within contact opening 52, and effective to form an insulative isolation mass 56 within contact opening 52 on conductive silicide 46. An oxide layer 57 will also tend to form upon semiconductive material of substrate 36. Insulative isolation mass 56 is characterized by, or of, a sufficient thickness to prevent undesirable electrical contact between conductive silicide 46 and conductive material which will be received within contact opening 52. In one preferred embodiment, the oxidizing conditions are effective to form insulative isolation mass 56 to have a minimum thickness of at least 50 Å. In the context of this document, "minimum thickness" refers to the shortest straight linear dimension from conductive silicide material 46 and conductive material ultimately provided within contact opening 52. Insulative isolation mass 46 can be formed to other greater alternate minimum thicknesses, for example of at least 100 Å, or of at least 150 Å, or greater.

Any suitable oxidizing conditions can be utilized effective to form an insulative isolation mass as herein defined. By way of example only, example dry oxidation conditions include 800° C., ambient pressure, $O_2$ flow at 6 slm, and $N_2$ flow at 30 slm. Further by way of example only, exemplary wet oxidation conditions include 800° C., ambient pressure, $N_2$ flow at 30 slm, $O_2$ flow at 8.0 slm, $H_2$ flow at 2 slm.

After the oxidizing, a preferred short punch dry etch is conducted to remove at least some, and preferably all, of oxide layer 57 from within contact opening 52. Some, but not all, of oxide mass 56 might also be removed during such etching. Exemplary preferred conditions include remote plasma etching, power at 400 Watts, susceptor temperature of 45 degrees C., pressure of 200 mTorr, CHF3 flow of 60 sccm and CF4 flow of 60 sccm. An exemplary time for the etching is from 5 seconds to 20 seconds, with lower times being preferred.

Figure 7:
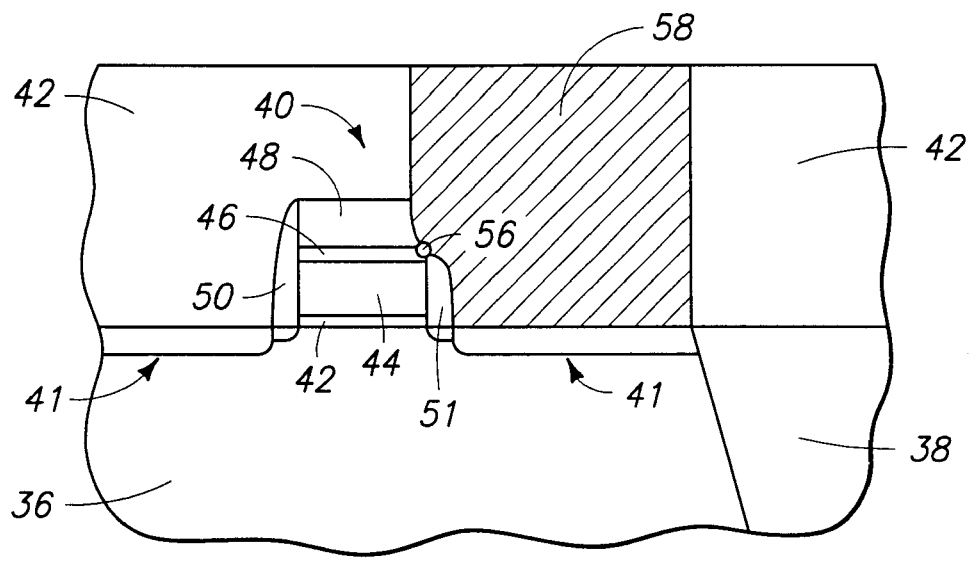
FIG. 7 is a view of the FIG. 6 wafer fragment at a processing step subsequent to that shown in FIG. 6.

Referring to FIG. 7, conductive material 58 is formed within contact opening 52. Such might include a single or multiple materials including silicide, glue layers, diffusion barrier materials, etc. In the depicted and preferred embodiment, conductive material 58 is formed to completely fill contact opening 52.

Figure 8:
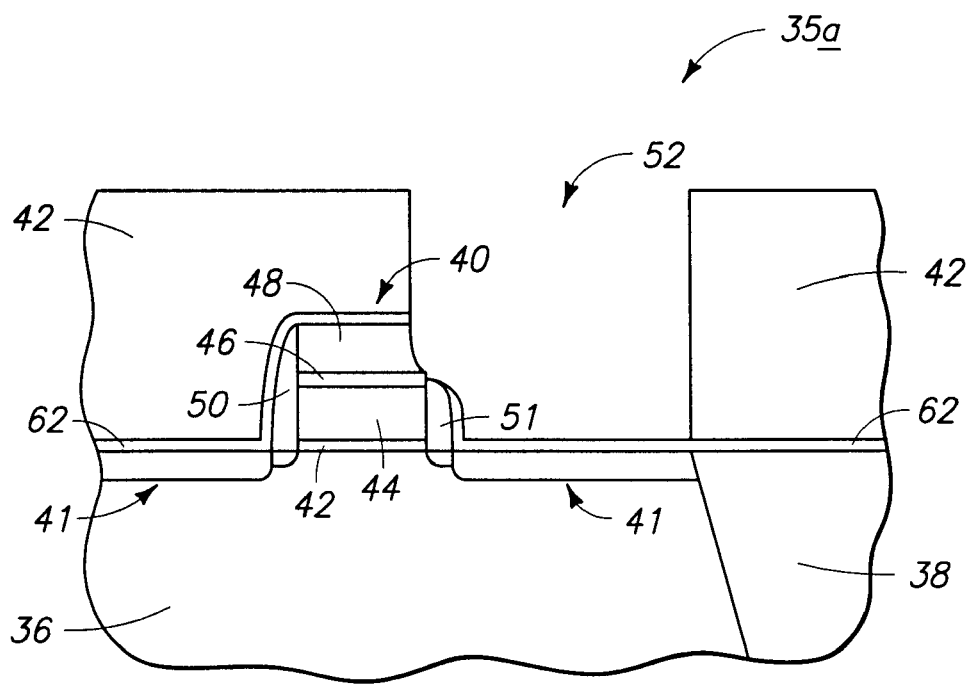
FIG. 8 is a diagrammatic sectional view of an alternate embodiment semiconductor wafer fragment at one processing step.

But one exemplary alternate embodiment is described with reference to FIGS. 8–11 with respect to a wafer fragment 35a. Like numerals from the first described embodiment are utilized where appropriate, with differences being indicated by the suffix "a" or with different numerals. Referring to FIG. 8, such corresponds in processing sequence to FIG. 5 of the first described embodiment. Such differs from the first described embodiment in the provision of an etch stop layer 62 over substrate 36/38 and transistor gate structure 40. Exemplary preferred materials for etch stop layer 62 are as described above in the "Background" section of this document. FIG. 8 depicts less than desired processing whereby the etching to form contact opening 52 has also etched a portion of etch stop layer 62 effective to expose a portion of conductive silicide 46.

Figure 9:
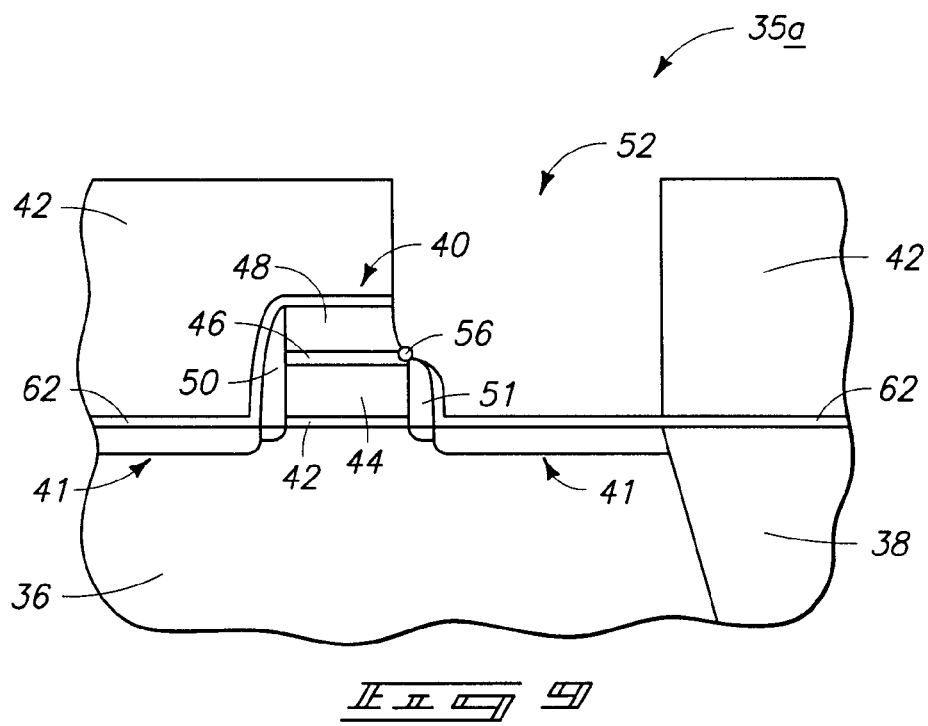
FIG. 9 is a view of the FIG. 8 wafer fragment at a processing step subsequent to that shown by FIG. 8.

Referring to FIG. 9, wafer fragment 35a has been exposed to suitable oxidizing conditions effective to oxidize exposed silicide within contact opening 52 to form insulative isolation mass 56.

Figure 10:
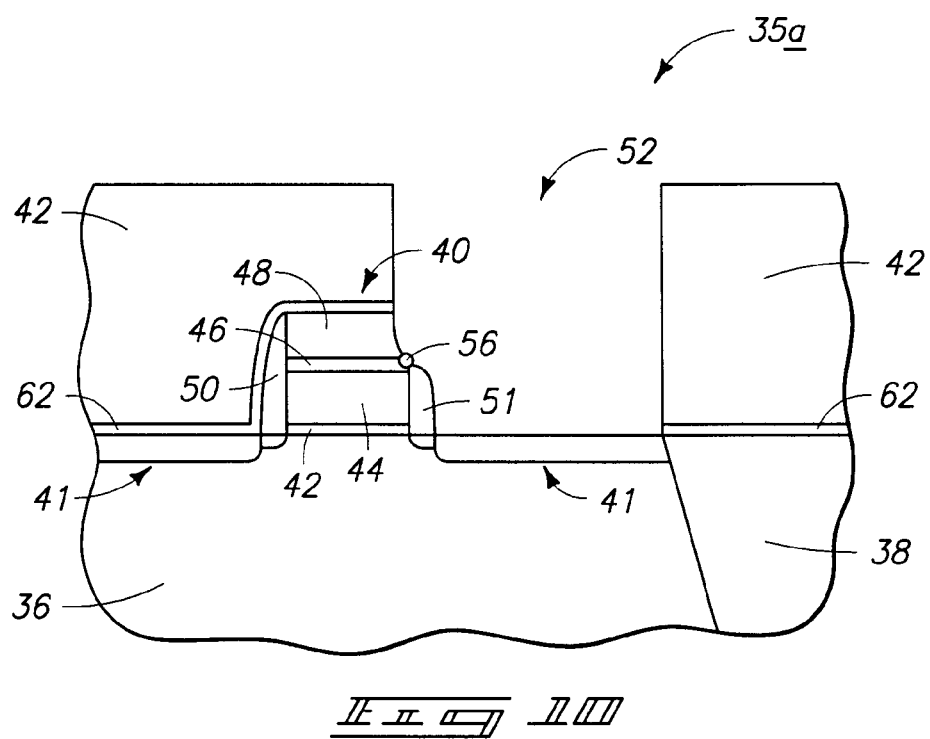
FIG. 10 is a view of the FIG. 9 wafer fragment at a processing step subsequent to that shown by FIG. 9.

Referring to FIG. 10, at least a portion of etch stop layer 62 has been etched through within contact opening 52 after oxidizing the exposed silicide effective to form isolation mass 56. By way of example only, and where etch stop layer 62 comprises a silicon oxynitride, a chemistry effective to do the same comprises a combination of $CHF_3$ and $CF_4$. A dry punch etch as described above might also be conducted.

Referring to FIG. 11, conductive material 58 is formed within contact opening 52.

The above-described preferred embodiments depict or describe methods wherein conductive suicide is exposed during the etching to form contact opening 52. However regardless of whether conductive suicide is exposed during the contact opening etching, the invention contemplates exposing the substrate to oxidizing conditions effective to oxidize any conductive silicide within the contact opening which might have been exposed during the contact opening etch. For example, the contact opening etching may or may not expose conductive silicide. Regardless, the substrate can be exposed to oxidizing conditions effective to oxidize any such silicide that was exposed to insure that an effective isolation mass is formed on any exposed silicide without necessarily verifying the presence of the same prior to conducting the oxidizing.

In another aspect, the invention contemplates conducting an actual determination to see if conductive silicide of the gate structure was exposed during the contact opening etching. Such could of course be conducted by some visual inspection with scanning electron microscope, or by other existing or yet-to-be developed methods. Regardless, if the determining were to reveal that conductive silicide of the gate structure was exposed during the etching, the exposed suicide within the effected contact openings could be oxidized effective to form the desired insulative isolation masses within the contact openings on the conductive silicide. Thereafter, conductive material would be formed within the contact openings and on the formed insulative isolation masses. If the determining reveals that conductive silicide of the gate structures were not exposed during the etching, conductive material could be formed within the contact openings without conducting the subject oxidizing.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a conductive contact comprising:
   forming a transistor gate structure over a substrate, the gate structure comprising a conductive silicide covered by insulative material, the conductive silicide being on and in direct contact with a conductively doped polysilicon layer;
   forming a dielectric layer over the substrate and the gate structure;
   etching the dielectric layer to form a contact opening adjacent the gate structure;
   after the etching, oxidizing utilizing oxidizing conditions effective to oxidize any conductive silicide within the contact opening exposed during the contact opening etch; and
   after the oxidizing, forming conductive material within the contact opening.

2. The method of forming a conductive contact of claim 1, wherein the conductive silicide is $WSi_x$.

3. The method of forming a conductive contact of claim 1, wherein the conductive silicide comprises an atomic ratio of silicon relative to metal of greater than 2:1.

4. The method of forming a conductive contact of claim 1, wherein the forming of the gate structure comprises forming an insulative sidewall spacer on at least one side of the gate structure, the etching exposing the insulative sidewall spacer.

5. The method of forming a conductive contact of claim 1, wherein the forming of the gate structure comprises forming an insulative sidewall spacer on at least one side of the gate structure, the insulative sidewall spacer having a height, the etching exposing the insulative sidewall spacer and reducing the height.

6. The method of forming a conductive contact of claim 1, wherein the forming of the gate structure comprises forming an insulative sidewall spacer on each side of the gate structure.

7. The method of forming a conductive contact of claim 1, wherein the forming of the gate structure comprises forming an insulative sidewall spacer on at least one side of the gate structure and forming an insulative cap on the conductive silicide, the etching exposing the insulative sidewall spacer.

8. The method of forming a conductive contact of claim 1, wherein the forming of the gate structure comprises forming an insulative sidewall spacer on each side of the gate structure and forming an insulative cap on the conductive silicide.

9. The method of forming a conductive contact of claim 1, wherein the conductive silicide is $WSi_x$, and wherein conductive silicide is exposed during the etching, and wherein the oxidizing conditions are effective to form an insulative isolation mass of a sufficient thickness to prevent undesirable electrical contact between the conductive silicide and the conductive material formed within the contact opening.

10. The method of forming a conductive contact of claim 9, wherein the oxidizing conditions are effective to form the insulative isolation mass to have a-thickness of at least 50 Angstroms between the conductive silicide and the conductive material within the contact opening.

11. The method of forming a conductive contact of claim 9, wherein the oxidizing conditions are effective to form the insulative isolation mass to have a thickness of at least 100 Angstroms between the conductive silicide and the conductive material within the contact opening.

12. The method of forming a conductive contact of claim 9, wherein the oxidizing conditions are effective to form the insulative isolation mass to have a thickness of at least 150 Angstroms between the conductive silicide and the conductive material within the contact opening.

13. The method of forming a conductive contact of claim 9, wherein after forming the transistor gate structure and before forming the dielectric layer, forming an etch stop layer over the substrate and the gate structure.

14. The method of forming a conductive contact of claim 13, wherein the etch stop layer is electrically insulative, and further comprising etching through at least a portion of the etch stop layer within the contact opening after the oxidizing.

15. The method of claim 1 wherein the substrate comprises semiconductive material and the oxidizing conditions oxidize at least some of the semiconductive material, the method further comprising etching at least some of the oxidized semiconductive material from the contact opening prior to forming the conductive material therewithin.

16. A method of forming a conductive contact, comprising:
   forming a transistor gate structure over a substrate, the gate structure comprising a conductive silicide covered by insulative material, the conductive silicide being on and in direct contact with a conductively doped polysilicon material;

forming a dielectric layer over the substrate and the gate structure;

etching the dielectric layer to form a contact opening adjacent the gate structure, the etching being effective to expose the conductive silicide of the gate structure;

after the etching, oxidizing the exposed silicide within the contact opening effective to form an insulative isolation mass within the contact opening on the conductive silicide; and after the oxidizing, forming conductive material within the contact opening and on the insulative isolation mass.

17. The method of forming a conductive contact of claim 16, wherein the conductive silicide is $WSi_x$.

18. The method of forming a conductive contact of claim 16, wherein the conductive silicide is a silicon rich silicide having a silicon to metal ratio of from greater than 2 to less than 3 silicon atoms per metal atom.

19. The method of forming a conductive contact of claim 16, wherein the forming of the gate structure comprises forming an insulative sidewall spacer on at least one side of the gate structure, the etching exposing the insulative sidewall spacer.

20. The method of forming a conductive contact of claim 16, wherein the forming of the gate structure comprises forming an insulative sidewall spacer on at least one side of the gate structure, the insulative sidewall spacer having a height, the etching exposing the insulative sidewall spacer and reducing the height.

21. The method of forming a conductive contact of claim 16, wherein the forming of the gate structure comprises forming an insulative sidewall spacer on at least one side of the gate structure and forming an insulative cap on the conductive silicide, the etching exposing the insulative sidewall spacer.

22. The method of forming a conductive contact of claim 16, wherein the insulative isolation mass is formed to have a thickness of at least 50 Angstroms between the conductive silicide and the conductive material within the contact opening.

23. The method of forming a conductive contact of claim 16, wherein the insulative isolation mass is formed to have a thickness of at least 100 Angstroms between the conductive silicide and the conductive material within the contact opening.

24. The method of forming a conductive contact of claim 16, wherein the insulative isolation mass is formed to have a thickness of at least 150 Angstroms between the conductive silicide and the conductive material within the contact opening.

25. The method of forming a conductive contact of claim 16, wherein after forming the transistor gate structure and before forming the dielectric layer, forming an etch stop layer over the substrate and the gate structure.

26. The method of forming a conductive contact of claim 25, comprising etching through at least a portion of the etch stop layer within the contact opening after oxidizing the exposed silicide.

27. The method of claim 16 wherein the substrate comprises semiconductive material, wherein the etching exposes the semiconductive material within the contact opening, and wherein the oxidizing oxidizes at least some of the semiconductive material within the contact opening, the method further comprising etching at least some of the oxidized semiconductive material from the contact opening prior to forming the conductive material therewithin.

28. A method of forming a conductive contact, comprising:

forming a transistor gate structure over a substrate, the gate structure comprising a conductive silicide, opposing etched insulative sidewall spacers, and an insulative cap on the conductive silicide;

forming a dielectric layer over the substrate and the gate structure;

etching into the dielectric layer to form a contact opening adjacent the gate structure, the etching exposing the insulative cap and one of the etched sidewall spacers within the contact opening;

after the etching, oxidizing utilizing oxidizing conditions effective to oxidize any conductive silicide within the contact opening exposed during the contact opening etch; and after the oxidizing, forming conductive material within the contact opening.

29. The method of forming a conductive contact of claim 28, wherein the conductive silicide is $WSi_x$.

30. The method of forming a conductive contact of claim 28, wherein the conductive silicide is a silicon rich silicide having a silicon to metal ratio of from greater than 2 to less than 3 silicon atoms per metal atom.

31. The method of forming a conductive contact of claim 28, wherein conductive silicide is exposed during the etching, and wherein the oxidizing conditions are effective to oxidize the exposed conductive silicide to form an insulative isolation mass to have a thickness of at least 50 Angstroms between the conductive silicide and the conductive material within the contact opening.

32. The method of forming a conductive contact of claim 28, wherein after forming the transistor gate structure and before forming the dielectric layer, forming an etch stop layer over the substrate and the gate structure.

33. The method of forming a conductive contact of claim 32, wherein the
method further comprises etching through at least a portion of the etch stop layer within the contact opening after the oxidizing.

34. The method of claim 28 wherein the substrate comprises semiconductive material and the oxidizing conditions oxidize at least some of the semiconductive material, the method further comprising etching at least some of the oxidized semiconductive material from the contact opening prior to forming the conductive material therewithin.

35. A method of forming a conductive contact, comprising:

forming a transistor gate structure over a substrate, the gate structure comprising a conductive silicide having an etched insulative sidewall spacer, and having an insulative cap on the conductive silicide;

forming an etch stop layer over the substrate and the gate structure;

after forming the etch stop layer, forming a dielectric layer over the substrate and the gate structure;

etching into the dielectric layer to form a contact opening adjacent the gate structure, the etching being effective to expose the conductive silicide of the gate structure;

after the etching, oxidizing the exposed conductive silicide within the contact opening effective to form an insulative isolation mass within the contact opening on the conductive silicide; and after the oxidizing, forming conductive material within the contact opening and on the insulative isolation mass.

36. The method of forming a conductive contact of claim 35, wherein the conductive silicide is $WSi_x$.

37. The method of forming a conductive contact of claim 35, wherein the conductive silicide is a silicon rich silicide having a silicon to metal ratio of from greater than 2 to less than 3 silicon atoms per metal atom.

38. The method of forming a conductive contact of claim 35, wherein the forming of the gate structure comprises forming an insulative sidewall spacer on each side of the gate structure.

39. The method of forming a conductive contact of claim 35, wherein the insulative isolation mass is formed to have a thickness of at least 50 Angstroms over the exposed conductive silicide.

40. The method of claim 35, wherein the substrate comprises semiconductive material and the oxidizing oxidizes at least some of the semiconductive material, the method further comprising etching at least some of the oxidized semiconductive material from the contact opening prior to forming the conductive material therewithin.

* * * * *